United States Patent
Solum

(10) Patent No.: US 7,962,111 B2
(45) Date of Patent: *Jun. 14, 2011

(54) DISTRIBUTED AUTOMATIC GAIN CONTROL SYSTEM

(75) Inventor: Jeff Solum, Deephaven, MN (US)

(73) Assignee: ADC Wireless, Inc., Eden Prairie, MN (US)

( * ) Notice: Subject to any disclaimer, the term of this patent is extended or adjusted under 35 U.S.C. 154(b) by 143 days.

This patent is subject to a terminal disclaimer.

(21) Appl. No.: 12/404,544

(22) Filed: Mar. 16, 2009

(65) Prior Publication Data

US 2009/0176448 A1    Jul. 9, 2009

Related U.S. Application Data

(63) Continuation of application No. 11/677,799, filed on Feb. 22, 2007, now Pat. No. 7,505,747, which is a continuation of application No. 10/084,115, filed on Feb. 25, 2002, now Pat. No. 7,184,728.

(51) Int. Cl.
   *H04B 7/00* (2006.01)
(52) U.S. Cl. ............... 455/234.1; 455/232.1; 455/277.1
(58) Field of Classification Search .............. 455/234.1, 455/234.2, 7, 239.1, 240.1, 241.1; 370/318
   See application file for complete search history.

(56) References Cited

U.S. PATENT DOCUMENTS

| | | |
|---|---|---|
| 4,144,409 A | 3/1979 | Utano et al. |
| 4,144,411 A | 3/1979 | Frenkiel |
| 4,183,054 A | 1/1980 | Patisaul et al. |
| 4,231,116 A | 10/1980 | Sekiguchi et al. |
| 4,451,699 A | 5/1984 | Gruenberg |
| 4,451,916 A | 5/1984 | Casper et al. |
| 4,456,793 A | 6/1984 | Baker et al. |
| 4,475,010 A | 10/1984 | Huensch et al. |
| 4,485,486 A | 11/1984 | Webb et al. |
| 4,525,861 A | 6/1985 | Freeburg |
| 4,556,760 A | 12/1985 | Goldman |
| 4,596,051 A | 6/1986 | Feldman |
| 4,611,323 A | 9/1986 | Hessenmiiller |
| 4,612,990 A | 9/1986 | Shu |
| 4,613,990 A | 9/1986 | Halpern |

(Continued)

FOREIGN PATENT DOCUMENTS

CA         2008900         1/1998

(Continued)

OTHER PUBLICATIONS

Merrett et al., "A Cordless Access System Using Radio-Over-Fibre Techniques", "41st IEEE Vehicular Technology Conference Gateway to the Future Technology in Motion", May 19, 1991, pp. 921-924, Published in: St.Louis, MO.

(Continued)

Primary Examiner — Lewis G West
(74) Attorney, Agent, or Firm — Fogg & Powers LLC

(57) ABSTRACT

A wireless distribution system includes a number of remote units distributed in a coverage area to receive wireless signals and to provide the signals through the distribution system to input ports of a node where the signals are combined, a number of input power monitors operatively connected to one or more of the input ports to determine power levels of signals received at the input ports, variable gain controllers to control signals received at some or all of the input ports, a node to combine a plurality of signals from the plurality of input ports, and a controller to provide control signals to control one or more of the variable gain controllers.

11 Claims, 2 Drawing Sheets

U.S. PATENT DOCUMENTS

| | | |
|---|---|---|
| 4,628,501 A | 12/1986 | Loscoe |
| 4,654,843 A | 3/1987 | Roza et al. |
| 4,667,319 A | 5/1987 | Chum |
| 4,669,107 A | 5/1987 | Eriksson-Lennartsson |
| 4,691,292 A | 9/1987 | Rothweiler |
| 4,726,644 A | 2/1988 | Mathis |
| 4,759,051 A | 7/1988 | Han |
| 4,760,573 A | 7/1988 | Calvignac et al. |
| 4,790,000 A | 12/1988 | Kinoshita |
| 4,797,947 A | 1/1989 | Labedz |
| 4,831,662 A | 5/1989 | Kuhn |
| 4,849,963 A | 7/1989 | Kawano et al. |
| 4,916,460 A | 4/1990 | Powell |
| 4,932,049 A | 6/1990 | Lee |
| 4,977,593 A | 12/1990 | Ballance |
| 4,999,831 A | 3/1991 | Grace |
| 5,067,147 A | 11/1991 | Lee |
| 5,067,173 A | 11/1991 | Gordon et al. |
| 5,084,869 A | 1/1992 | Russell |
| 5,159,479 A | 10/1992 | Takagi |
| 5,175,867 A | 12/1992 | Wejke et al. |
| 5,193,109 A | 3/1993 | Chien-Yeh Lee |
| 5,243,598 A | 9/1993 | Lee |
| 5,251,053 A | 10/1993 | Heidemann |
| 5,267,261 A | 11/1993 | Blakeney, II et al. |
| 5,278,690 A | 1/1994 | Vella-Coleiro |
| 5,280,472 A | 1/1994 | Gilhousen et al. |
| 5,285,469 A | 2/1994 | Vanderpool |
| 5,297,193 A | 3/1994 | Bouix et al. |
| 5,299,168 A | 3/1994 | Kang |
| 5,301,056 A | 4/1994 | O'Neill |
| 5,303,287 A | 4/1994 | Laborde |
| 5,305,308 A | 4/1994 | English et al. |
| 5,309,474 A | 5/1994 | Gilhousen et al. |
| 5,313,461 A | 5/1994 | Ahl et al. |
| 5,321,736 A | 6/1994 | Beasley |
| 5,321,849 A | 6/1994 | Lemson |
| 5,339,184 A | 8/1994 | Tang |
| 5,381,459 A | 1/1995 | Lappington |
| 5,392,453 A | 2/1995 | Gudmundson et al. |
| 5,400,391 A | 3/1995 | Emura et al. |
| 5,442,700 A | 8/1995 | Snell et al. |
| 5,457,557 A | 10/1995 | Zarem et al. |
| 5,461,627 A | 10/1995 | Rypinski |
| 5,519,691 A | 5/1996 | Darcie et al. |
| 5,545,397 A | 8/1996 | Spielvogel et al. |
| 5,552,920 A | 9/1996 | Glynn |
| 5,566,168 A | 10/1996 | Dent |
| 5,586,121 A | 12/1996 | Moura et al. |
| 5,587,734 A | 12/1996 | Lauder et al. |
| 5,592,470 A | 1/1997 | Rudrapatna et al. |
| 5,603,060 A | 2/1997 | Weinberger et al. |
| 5,603,080 A | 2/1997 | Kallander et al. |
| 5,621,786 A | 4/1997 | Fischer et al. |
| 5,627,879 A | 5/1997 | Russell et al. |
| 5,630,204 A | 5/1997 | Hylton et al. |
| 5,642,405 A | 6/1997 | Fischer et al. |
| 5,644,622 A | 7/1997 | Russell et al. |
| 5,657,374 A | 8/1997 | Russell et al. |
| 5,682,256 A | 10/1997 | Motley et al. |
| 5,724,385 A | 3/1998 | Levin et al. |
| 5,732,076 A | 3/1998 | Ketseoglou et al. |
| 5,752,170 A | 5/1998 | Clifford |
| 5,761,619 A | 6/1998 | Danne et al. |
| 5,765,097 A | 6/1998 | Dail |
| 5,765,099 A | 6/1998 | Georges et al. |
| 5,774,085 A | 6/1998 | Yanagimoto et al. |
| 5,774,660 A | 6/1998 | Brendel et al. |
| 5,774,789 A | 6/1998 | Van der Kaay et al. |
| 5,781,541 A | 7/1998 | Schneider |
| 5,781,859 A | 7/1998 | Beasley |
| 5,781,865 A | 7/1998 | Gammon |
| 5,802,173 A | 9/1998 | Hamilton-Piercy et al. |
| 5,805,983 A | 9/1998 | Naidu et al. |
| 5,809,395 A | 9/1998 | Hamilton-Piercy et al. |
| 5,822,324 A | 10/1998 | Kostresti et al. |
| 5,852,651 A | 12/1998 | Fischer et al. |
| 5,874,914 A | 2/1999 | Krasner |
| 5,878,325 A | 3/1999 | Dail |
| 5,907,544 A | 5/1999 | Rypinski |
| 5,946,622 A | 8/1999 | Bojeryd |
| 5,969,837 A | 10/1999 | Farber et al. |
| 5,987,014 A | 11/1999 | Magill et al. |
| 6,005,884 A | 12/1999 | Cook et al. |
| 6,034,950 A | 3/2000 | Sauer et al. |
| 6,061,089 A | 5/2000 | Tonkin et al. |
| 6,108,113 A | 8/2000 | Fee |
| 6,108,550 A | 8/2000 | Wiorek et al. |
| 6,108,626 A | 8/2000 | Cellario et al. |
| 6,112,086 A | 8/2000 | Wala |
| 6,122,529 A | 9/2000 | Sabat, Jr. et al. |
| 6,147,786 A | 11/2000 | Pan |
| 6,157,659 A | 12/2000 | Bird |
| 6,188,693 B1 | 2/2001 | Murakami |
| 6,198,558 B1 | 3/2001 | Graves et al. |
| 6,222,660 B1 | 4/2001 | Traa |
| 6,223,021 B1 | 4/2001 | Silvia et al. |
| 6,226,274 B1 | 5/2001 | Reese et al. |
| 6,263,135 B1 | 7/2001 | Wade |
| 6,337,754 B1 | 1/2002 | Imajo |
| 6,349,200 B1 | 2/2002 | Sabat, Jr. et al. |
| 6,362,908 B1 | 3/2002 | Kimbrough et al. |
| 6,373,887 B1 | 4/2002 | Aiyagari et al. |
| 6,374,124 B1 | 4/2002 | Slabinski |
| 6,377,640 B2 | 4/2002 | Trans |
| 6,396,908 B1 | 5/2002 | O'Donovan et al. |
| 6,463,301 B1 | 10/2002 | Bevan et al. |
| 6,486,907 B1 | 11/2002 | Farber et al. |
| 6,496,290 B1 | 12/2002 | Lee |
| 6,498,936 B1 | 12/2002 | Raith |
| 6,535,720 B1 | 3/2003 | Kintis et al. |
| 6,567,473 B1 | 5/2003 | Tzannes |
| 6,580,905 B1 | 6/2003 | Naidu et al. |
| 6,643,498 B1 | 11/2003 | Miyajima |
| 6,667,973 B1 | 12/2003 | Gorshe et al. |
| 6,674,966 B1 | 1/2004 | Koonen |
| 6,704,545 B1 | 3/2004 | Wala |
| 6,729,929 B1 | 5/2004 | Sayers et al. |
| 6,738,581 B2 | 5/2004 | Handelman |
| 6,768,745 B1 | 7/2004 | Gorshe et al. |
| 6,785,558 B1 | 8/2004 | Stratford et al. |
| 6,799,020 B1 | 9/2004 | Heidmann et al. |
| 6,826,163 B2 | 11/2004 | Mani et al. |
| 6,826,164 B2 | 11/2004 | Mani et al. |
| 6,831,901 B2 | 12/2004 | Millar |
| 6,865,390 B2 | 3/2005 | Goss et al. |
| 6,907,048 B1 | 6/2005 | Treadaway et al. |
| 6,917,614 B1 | 7/2005 | Laubach et al. |
| 6,980,831 B2 | 12/2005 | Matsuyoshi et al. |
| 7,047,313 B1 | 5/2006 | Broerman |
| 7,103,279 B1 | 9/2006 | Koh et al. |
| 7,127,175 B2 | 10/2006 | Mani et al. |
| 7,184,728 B2 | 2/2007 | Solum |
| 7,205,864 B2 | 4/2007 | Schultz, Jr. et al. |
| 7,215,651 B2 | 5/2007 | Millar |
| 7,289,972 B2 | 10/2007 | Rieser et al. |
| 7,313,415 B2 | 12/2007 | Wake et al. |
| 2002/0003645 A1 | 1/2002 | Kim et al. |
| 2002/0072329 A1 | 6/2002 | Bandeira et al. |
| 2002/0167954 A1 | 11/2002 | Highsmith et al. |
| 2002/0191565 A1 | 12/2002 | Mani et al. |
| 2003/0015943 A1 | 1/2003 | Kim et al. |
| 2003/0043928 A1 | 3/2003 | Ling et al. |
| 2003/0162516 A1 | 8/2003 | Solum |
| 2004/0010609 A1 | 1/2004 | Vilander et al. |
| 2004/0037565 A1 | 2/2004 | Young et al. |
| 2004/0198453 A1 | 10/2004 | Cutrer et al. |
| 2004/0219950 A1 | 11/2004 | Pallonen et al. |
| 2005/0007993 A1 | 1/2005 | Chambers et al. |
| 2005/0147067 A1 | 7/2005 | Mani et al. |
| 2005/0201323 A1 | 9/2005 | Mani et al. |
| 2005/0243785 A1 | 11/2005 | Sabat, Jr. et al. |
| 2005/0250503 A1 | 11/2005 | Cutrer |
| 2006/0121944 A1 | 6/2006 | Buscaglia et al. |
| 2006/0193295 A1 | 8/2006 | White et al. |

FOREIGN PATENT DOCUMENTS

| | | |
|---|---|---|
| EP | 0166885 | 1/1986 |
| EP | 0346925 | 12/1989 |
| EP | 0368673 | 5/1990 |
| EP | 0391597 | 10/1990 |
| EP | 0468688 | 1/1992 |
| EP | 0664621 | 7/1995 |
| EP | 0876073 | 11/1998 |
| FR | 2345865 | 10/1977 |
| GB | 2253770 | 9/1992 |
| GB | 2289198 | 11/1995 |
| GB | 2315959 | 2/1998 |
| GB | 2320653 | 6/1998 |
| JP | 58164007 | 9/1983 |
| JP | 3026031 | 2/1991 |
| WO | 9115927 | 10/1991 |
| WO | 9533350 | 12/1995 |
| WO | 9628946 | 9/1996 |
| WO | 9716000 | 5/1997 |
| WO | 9732442 | 9/1997 |
| WO | 9824256 | 6/1998 |
| WO | 9937035 | 7/1999 |
| WO | 0174013 | 10/2001 |
| WO | 0174100 | 10/2001 |

OTHER PUBLICATIONS

Lee et al., "Intelligent Microcell Applications in PCS", "43rd IEEE Vehicular Technology Conference, Personal Communication—Freedom Through Wireless Technology", May 18, 1993, pp. 722-725, Publisher: Pactel Corporation, Published in: Secaucus, NJ.
Lewis, "ADC-Kentrox Call Report With Bell Atlantic", Oct. 18, 1992.
ADC Kentrox, "ADC Kentrox Introduces Innovative Wireless Network Access Solution Cellular Subscribers Offered a New Level of Portable", Mar. 1, 1993, pp. 1-3, Publisher: ADC Kentrox, Published in: Portland, OR.
"ADC Kentrox Wireless Systems Group Citycell 824—A Positioning White Paper", Mar. 1993, Publisher: Cita Trade Show.
"And Now a Few Words From Your Customers", "And Now a Few Words From Your Customers", Aug. 1992, pp. 14, Publisher: ADC Kentrox, Published in: Portland,OR.
Foxcom Wireless Proprietary Information, "Application Note Rfiber-RF Fiberoptic Links for Wireless Applications", 1998, pp. 3-11.
Cox, "A Radio System Proposal for Widespread Low-Power Tetherless Communications", "IEEE Transactions on Communications", Feb. 1991, pp. 324-335, vol. 39, No. 2, Publisher: IEEE.
Ishio, "A Two-Way Wavelength-Division-Multiplexing Transmission and Its Application to a Switched TV-Distribution System", , Publisher: Ekectrical Communication Laboratories, Nipon Telegraph and Telephone Corporation , Published in: Yokosuka, Japan.
Ameritech, "Broadband Optical Transport Digital Microcell Connection Service-Interface and Performance Specifications a Technical D", "Cellular Industry", Oct. 1993, pp. 1-26, Publisher: The Day Group.
City Cell, Cellular Industry the Day Group, "ADC Kentrox Citycell Field Trial Yields Another First—Simultaneous Analog and Digital Calls", 1992.
Stern, "Passive Optical Local Networks for Telephony Applications and Beyond", "Electronics Letters an International Publication", Nov. 19, 1987, pp. 1255-1257, vol. 23, No. 24, Publisher: IEEE.
"ADC Kentrox Introduces Citycell 824, A Replacement for Conventional Cell Sites; Company'S Original Goal Was to Improve F", "Telocator Bulletin", Feb. 1993.
Tang, "Fiber Optic Antenna Remoting for Multi-Sector Cellular Cell Sites", "GTE Laboratories—Abstract", Jun. 14-18, 1992.
ADC Kentrox, "First Field Trial Results Exceed Expectations ADC Kentrox and Cellular One Join Force to Provide a New Level of Portable", Mar. 2, 1993, pp. 1-2, Publisher: ADC Kentrox, Published in: Portland, OR.
Payne et al., "Single Mode Optical Local Networks", "Globecom '85 IEEE Global Telecommunications Conference", Dec. 2-5, 1985, pp. 1201-1206, vol. 3 of 3, Publisher: IEEE, Published in: New Orleans,LA.
Grace, Martin K., "Synchronous Quantized Subcarrier Multiplexing for Transport of Video, Voice and Data", "IEEE Journal on Selected Areas in Communications", Sep. 1990, pp. 1351-1358, vol. 8, No. 7, Publisher: IEEE.
Harvey et al., "Cordless Communications Utilising Radio Over Fibre Techniques for the Local Loop", "IEEE International Conference on Communications", Jun. 1991, pp. 1171-1175, Publisher: IEEE.
Steele, "Towards a High-Capacity Digital Cellular Mobile Radio System", "IEEE Proceedings-F Special Issue on Land Mobile Radio", Aug. 1985, pp. 405-415, vol. 132, PT F, No. 5, Publisher: IEEE.
Akos et al., "Direct Bandpass Sampling of Multiple Distinct RF Signals", "IEEE Transactions on Communications", Jul. 1999, pp. 983-988, vol. 47, No. 7.
Titch, "Kentrox Boosts Coverage and Capacity", "Telephony", Jan. 25, 1993.
Gupta et al., "Land Mobile Radio Systems—A Tutorial Exposition", "IEEE Communications Magazine", Jun. 1985, pp. 34-45, vol. 23, No. 6, Publisher: IEEE.
Foxcom Wireless Properietary Information, "Litenna In-Building RF Distribution System", 1998, pp. 1-8, Publisher: Foxcom Wireless.
Schneiderman, "Offshore Markets Gain in Size, Competitiveness Even the Smallest Industry Companies Are Expanding Their Global Buisness", "Microwaves and RF", Mar. 1993, pp. 33-39, vol. 32, No. 3, Publisher: Penton Publishing, Inc, Published in: Berea, OH.
"Digital Transport for Cellular", "Microwaves and RF", Feb. 1993, Published in: Portland, OR.
Russell, "New Microcell Technology Sets Cellular Carriers Free", "Telephony", Mar. 1993, pp. 40, 42, and 46.
Cellular Industry, The Day Group, "New Signal Transport Technology Digitizes the Cellular Band", Dec. 22, 2000.
Kobb, "Personal Wireless", "IEEE Spectrum", Jun. 1993, pp. 20-25, Publisher: IEEE.
Nakatsugawa et al., "Software Radio Base and Personal Stations for Cellular-PCS Systems", 2000, pp. 617-621, Publisher: IEEE.
"Tektronix Synchronous Optical Network (SONET)", "http://www.iec.org/online/tutorials/sonet/topic03.html", 2002, Publisher: International Engineering Consortium.
Quinn, "The Cell Enhancer", 1982, pp. 77-83, Publisher: Bell Atlantic Mobile Systems.
"Urban Microcell System Layout—Presentation", Jun. 14-18, 1992, Publisher: GTE Laboritories.
O'Byrne, "TDMA and CDMA in a Fiber-Optic Environment", "Vehicular Technology Society 42nd VTS Conference Frontiers of Technology From Pioneers to the 21st Century", May 10-13, 1992, pp. 727-731, vol. 2 of 2, Publisher: GTE Laboratories Inc., Published in: Denver, CO.
Wala, "A New Microcell Architecture Using Digital Optical Transport", "Freedom Through Wireless Technogolgy", May 18, 1993, pp. 585-588, Publisher: Proceedings of the Vehicular Technology Conference, New York, IEEE, Published in: US.
Zonemaster, "Maximum Coverage for High-Capacity Locations", "1993 Decibel Products", 1993, pp. 1-4, Publisher: Decibel Multi Media Microcell System.

DISTRIBUTED AUTOMATIC GAIN CONTROL SYSTEM

CROSS REFERENCE TO RELATED CASE

This application is a continuation of application Ser. No. 11/677,799 filed on Feb. 22, 2007 (pending), entitled "DISTRIBUTED AUTOMATIC GAIN CONTROL SYSTEM", which, in turn, is a continuation of application Ser. No. 10/084,115 filed on Feb. 25, 2002 (issued), entitled "DISTRIBUTED AUTOMATIC GAIN CONTROL SYSTEM", all of which applications are incorporated herein by reference.

BACKGROUND INFORMATION

The operational range of a system that combines and distributes signals within buildings or other areas where wireless signal propagation is likely to be a problem, whether the signals are digital or analog or some combination of both, is limited by the dynamic range handling capability of the system. In a distributed system, such as the one disclosed in U.S. patent application Ser. No. 09/619,431, "Point-To-Point Digital Radio Frequency Transport," filed on Jul. 19, 2000, incorporated herein by reference as if fully set forth, signals of varying levels are present at input ports, at signal combiners and at output ports. A large signal at a single input port may potentially saturate the output port (e.g., cause an overflow condition) if the large signal exceeds the dynamic range of the system and is not controlled in some way.

Even if a saturation level is not reached, a large signal may effectively limit the amount of traffic that the system can handle. For example, capacity in a spread spectrum system, such as a system employing a spreading function (for example, code division multiple access (CDMA), IEEE 802.11 complimentary code keying (CCK), or the like) is generally limited by the total amount of power allowed for all users in the bandwidth of interest in order to prevent unacceptable interference. Thus, power levels of spread spectrum mobile unit transmitters are continually adjusted to a level that is sufficient to maintain good signal reception at the base station but also minimizes signal power levels. For signals from mobile units that are supported by the distributed point-to-multipoint digital micro-cellular communication system (distributed communication system), power level adjustment works seamlessly. For example, if the signal from a supported mobile unit is boosted and provided to a base station, the base station will inform the mobile unit that its transmitter power should be correspondingly reduced. However, the frequency spectrum that is received, processed and distributed by the distributed communication system is shared by many services and devices and thus the distributed communication system will likely receive and process signals from communication services that are not supported by the system as well as from other sources of interference in the band. For example, the communications standard for wireless local networks, IEEE 802.11, calls for using the 2.4 GHz Industrial Scientific Medical (ISM) band. The 2.4 GHz ISM band has been called the "junk band" because it is contaminated by microwave oven emissions. Such non-supported and interfering signals may reach significant power levels in the coverage area and cause significant problems.

For example, a distributed communication system in a building or other enclosure may share a coverage area with a non-supported service. Further, the non-supported service may have mobile units in the coverage area that share the same bandwidth with the distributed communication system. Unfortunately, the mobile units from the non-supported service may transmit at much higher power levels compared to the distributed communication system to provide for good reception by the non-supported base station, which may be located a significant distance from the building or enclosure. This power level may be many orders of magnitude greater than signals from supported sources that are much closer to radio transceivers in the building or enclosure and may effectively "power limit" the capacity of the system or saturate the distributed communications system.

The above-mentioned problems with controlling the gain of wireless signals in distributed communication systems within buildings and other enclosed areas, as well as other problems, are addressed by the present invention and will be understood by reading and studying the following specification.

SUMMARY

A wireless distribution system according to one aspect of the present invention includes a plurality of remote units distributed in a coverage area to receive wireless signals in the coverage area and provide the signals to a plurality of input ports to receive signals comprising the signals provided by the plurality of remote units a plurality of input power monitors operatively connected to one or more of the plurality of input ports to determine power levels of signals received at the input port a plurality of variable gain controllers to control the gain of signals received at the one or more of the plurality of input ports in response to a control signal, a node to combine a plurality of signals from the plurality of input ports, and a controller to provide control signals to individually control each of the variable gain controllers.

DETAILED DESCRIPTION

In the following detailed description of the preferred embodiments, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1:
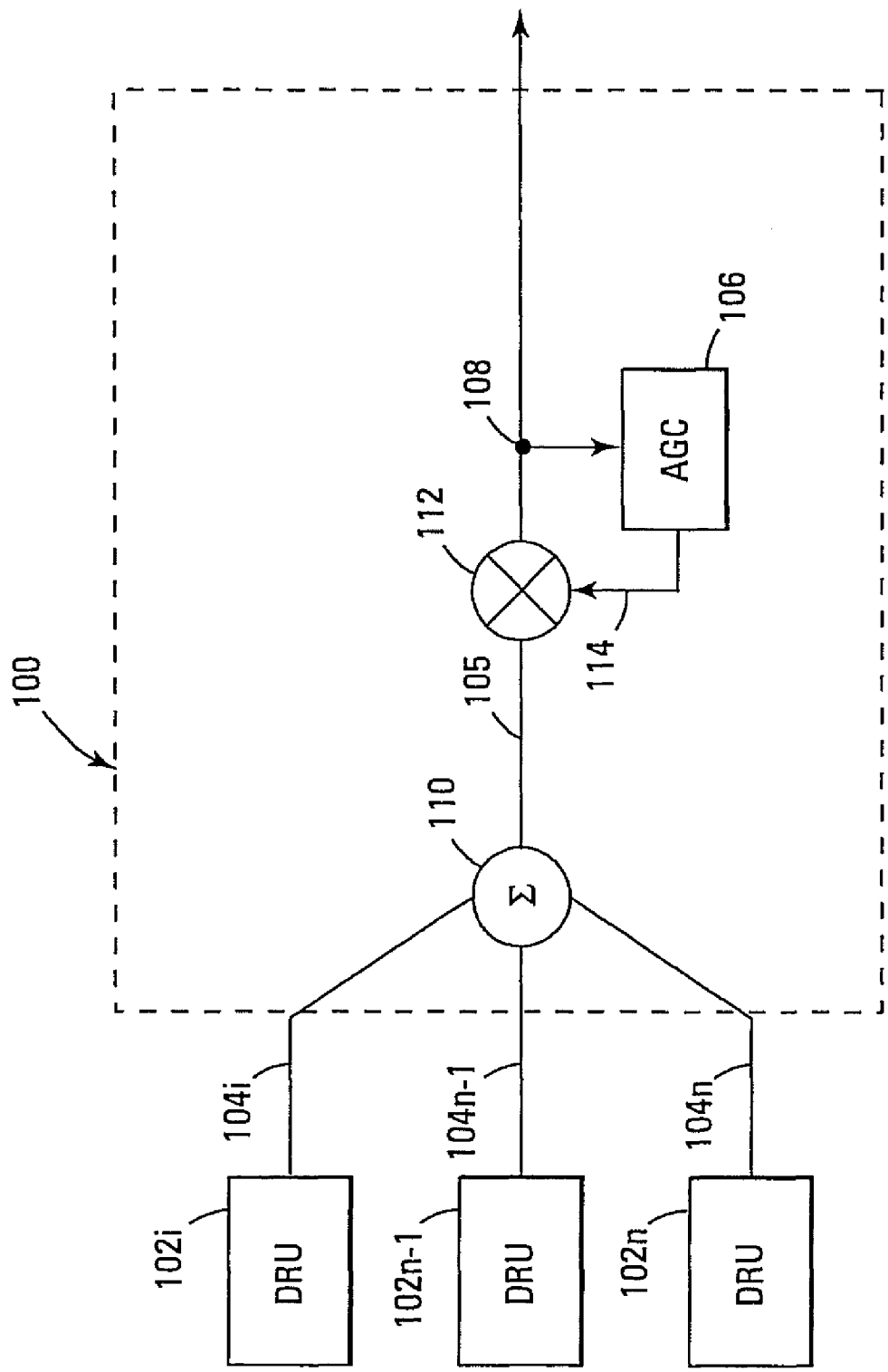
FIG. 1 is an illustration of one embodiment of an automatic gain control circuit according to the teachings of the present invention.

FIG. 1 is an illustration of a representative system 100 for distribution of wireless signals in a difficult environment for wireless signal propagation, such as in a large building or enclosure. The present invention is not limited to wireless signal propagation in and around buildings or other enclosures but is applicable to enhanced wireless systems for any coverage area. The system 100 includes a number of digital remote units (DRUs) $102_i$ to $102_n$ that receive a frequency spectrum of wireless signals such as may be transmitted by low power wireless devices in and around the building. In general, the DRUs process the spectrum of wireless signals so that the spectrum can be transmitted over transmission links $104_i$ to $104_n$, which may include one or more transmission media such as fiber optic, coaxial, twisted pair or simple copper wire, wireless link, or other medium of information transmission, and interface devices for such media or combinations thereof. The signals may be processed before, during and after transmission over the transmission links $104_i$ to $104_n$ to improve signal characteristics and propagation over the transmission media. Processing of the signals may include analog to digital conversion, analog and digital filtering, mixing and frequency translation, amplification and other well-known signal processing techniques. The transmission links $104_i$ to $104_n$ terminate at a node 110 where the signals are combined. Signals combined at node 110 can originate from the various DRUs 102 as well as from other upstream nodes such as digital extension units (DEUs), which also combine signals from DRUs or other DEUs.

In general, the frequency spectrum served by distribution system 100 is shared by a number of users and services. Users and services that are supported by distribution system 100 will usually be subject to and will abide by power control limitations of the system so that signal interference will not result from the use of excessive power. However, not all of the users and services sharing the frequency spectrum are supported by distribution system 100 and some of the signals, particularly those that are not subject to the power control limitations imposed by supported services may reach sufficient amplitude such that they may interfere with signals supported by the distribution system. This is particularly likely if strong signals are broadcast in close proximity to a receiving unit such as DRUs $102_i$ to $102_n$. The distributed wireless communication system has a limited dynamic range and accordingly must be protected from signals that would saturate or otherwise exceed the dynamic range handling capability of the system.

One example of an AGC circuit for use in a distributed communication system according to the present invention is shown in FIG. 1. DEU 100 includes a node 110 for summing signals received on transmission links $104_i$ to $104_n$. AGC circuit 106 is inserted upstream of node 110 in order to protect the transmission system from reaching saturation levels. AGC circuit 106 senses a power level at power sensor 108 in transmission link 105 and feeds back a gain control signal by control 114 to node 112 where gain control is applied to the summed signals on transmission link 105. In this way, gain control is provided upstream from node 110 so that an overflow condition is avoided. While the system of FIG. 1 shows only one DEU, it should be understood that many such DEUs may be included in a large distributed communication system.

Figure 2:
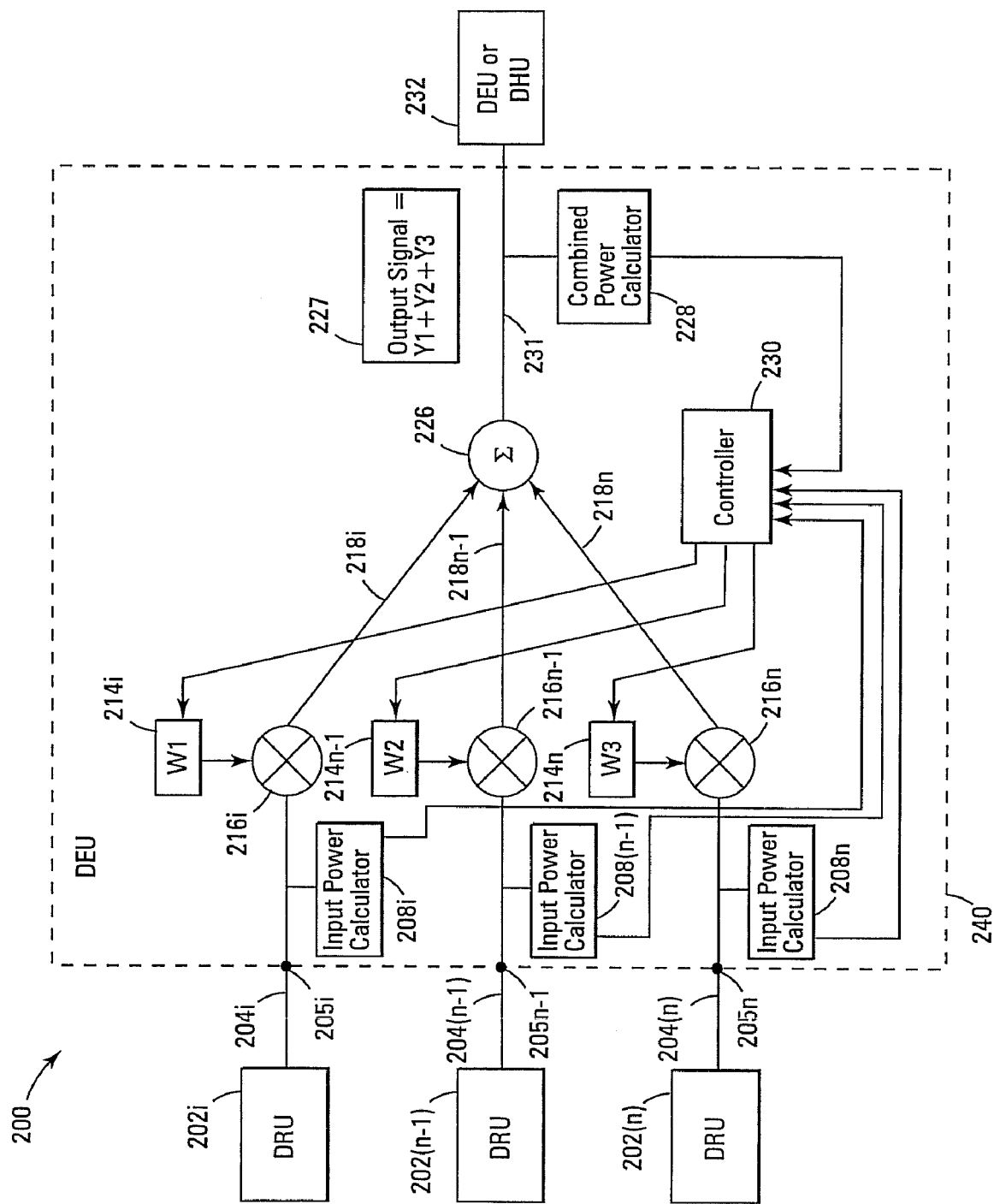
FIG. 2 is a block diagram of one embodiment of a distributed automatic gain control for a distributed communication system according to the teachings of the present invention.

FIG. 2 is an illustration of one additional example of a distributed automatic gain system 200 according to the present invention. System 200 controls the gain of signals distributed in a multiple point to point wireless system to enhance signal coverage, particularly in areas such as buildings and other enclosures where wireless signal coverage is a problem. The system 200 includes a number of digital remote units $202_i$ to $202_n$ that receive wireless signals and process them for delivery upstream over transmission links $204_i$ to $204_n$. In general such transmission links may be fiber optic, coaxial, twisted pair, wireless, or other medium of information transmission, or combination thereof. Each DRU $202_i$ to $202_n$ includes an input port or receiver that receives, processes and digitizes a wireless bandwidth. In one example each DRU receives the same wireless bandwidth. The DRUs $202_i$ to $202_n$ transmit the digitized signals upstream to a digital expansion unit (DEU) or to a digital host unit (DHU) represented by summing junction 226. Summing junction 226 sends the summed digitized signals to another DEU or a digital host unit 228 (DHU) located further upstream.

DEU 240 has a number of input ports $205_i$ to $205_n$ for receiving transmission links $204_i$ to $204_n$ from each DRU or DEU located upstream from DEU 240. Each input port $205_i$ to $205_n$ has associated with it an input power level calculator $208_i$ to $208_n$ to determine power levels of signals received over transmission links $204_i$ to $204_n$. The input power level calculators $208_i$ to $208_n$ provide power level signals to controller 230. Controller 230, which may be a dedicated controller or part of a larger system-wide controller, determines weights for gain control of the distribution system. Controller 230 determines weights $214_i$ to $214_n$ for individually controlling the gain of signals received over transmission links $204_i$ to $204_n$ at multipliers $216_i$ to $216_n$ so that the signals do not exceed a predetermined threshold level. The gain controlled signals are then provided to node 226 via transmission links $218_i$ to $218_n$. Node 226 digitally sums the signals from transmission links $218_i$ to $218_n$. Combined power level calculator 228 determines the power level of the signals combined at node 226 and provides the combined power level signal to controller 230. The combined signals are then transmitted upstream via transmission link 231 to DHU or DEU 232. Output signal 227 on transmission link 231 is the combined signals of $218_i$ to $218_n$. If the combined power level calculator 228 sees a combined signal power that exceeds a predetermined level, then the coefficients $214_i$ to $214_n$ are set by controller 230 and assigned based on the Power Calculators $208_i$ to $208_n$. The weights of coefficients $214_i$ to $214_n$ are set by the controller based on the individual input power calculators $208_i$ to $208_n$. Thus, the smaller the input signal the larger the corresponding weighted coefficient.

When the signal, 231, at Power Calculator 228 is lower than a predetermined "decay threshold", the weighted coefficients $214_i$ to $214_n$ are increased over time based on a decay time constant and a fair weighting based on input Power calculators $208_i$ to $208_n$ is applied to the input signals $204_i$ to $204_n$ until a satisfactory power level is achieved at combined power calculator 228. Conversely, when the signal, 231, at combined power calculator 228 is higher than a predetermined "attack threshold," the weighted coefficients $214_i$ to $214_n$ are decreased over time based on an attack time constant and a fair weighting based on input Power calculators $208_i$ to $208_n$ is applied to the input signals $204_i$ to $204_n$ until a satisfactory power level is achieved at combined power calculator 228.

Operation of one example of a distributed AGC system according to the present invention will now be described. While the system of FIG. 2 shows only one DEU, many such DEUs may be included in a large distributed communication system.

The weighted coefficients $214_i$ to $214_n$ are initially set to provide a minimum attenuation level of the combined signals on transmission link 231. When the level of the combined signals on transmission link 231 exceeds a predetermined threshold as determined by combined power level calculator 228, controller 230 which signal or signals exceed a threshold level and will attenuate those signals so that the combined power at 228 avoids an overflow condition at the node. Signal levels at each input port $205_i$ to $205_n$ are monitored and evaluated by input power calculators $208_i$ to $208_n$ to determine whether any transmission link $204i$ to $204n$ is providing a signal that exceeds a predetermined level. If one or more of the input power calculators $208_i$ to $208_n$ reports a signal level that exceeds the threshold, signals from those input ports will be gain controlled by adjusting weights $214_i$ to $214_n$ until all input signal levels are at or below a level such that an overflow condition is avoided. The thresholding and gain control process may be duplicated at other DEUs upstream or downstream from node 226 so Monitoring of the signal levels at the input ports may take place continuously or may be triggered only after combined power calculator 228 senses a combined signal level that warrants a change in gain control of the combined signals at the node. Alternatively, signal levels at the input ports may be polled periodically to determine whether signal levels may have changed.

In one additional example of the present invention, a frequency selective attenuation device such as an adaptive filter may be used to attenuate only those frequencies at which the offending signals are found. This may be preferable in applications where the interfering signals are confined to specific frequencies and other desirable signals would be lost if the overall gain of signals from one or more DRUs were controlled. In another example, combined power calculator 228 may be eliminated entirely and distributed AGC performed by adjusting the gain of the signals received upstream from the DRUs. Of course, an AGC unit would be required for each DRU and for each signal path in which signal gain might increase by interference, amplification or otherwise.

CONCLUSION

A distributed wireless AGC system has been described. The distributed wireless AGC system includes a number of remote units distributed in a coverage area to receive wireless signals in the coverage area, a number of input ports to receive signals from the remote units, input power monitors operatively connected to each of the input ports to determine power levels of signals received at each input port, variable gain controllers to control the gain of signals received at each of the input ports in response to a control signal, a node to combine a plurality of signals from the plurality of input ports, a combined power monitor to determine power levels of the signals combined at the node, a controller to provide control signals to control the gain of each of the variable gain controllers based on a weighting function that is proportional to power received at each input port, as determined by the input power monitors such that the combined power as determined by the combined power monitor does not exceed a predetermined level.

Although specific embodiments have been illustrated and described herein, it will be appreciated by those of ordinary skill in the art that any arrangement which is calculated to achieve the same purpose may be substituted for the specific embodiments shown. For example, DHUs and DEUs are not limited to the receipt, gain control of and summing, splitting and transmitting of digitized wireless signals. In some examples of the present invention, DHUs and DEUs are capable of receiving, processing, gain controlling and summing analog wireless signals in addition to or instead of digitized wireless signals. As well, DHUs and DEUs may be capable of splitting, processing and transmitting analog wireless signals in addition to or instead of digitized wireless signals. This application is intended to cover any adaptations or variations of the present invention. Therefore, it is intended that this invention be limited only by the claims and the equivalents thereof.

What is claimed is:

1. A wireless distribution system comprising:
    a plurality of remote units distributed in a coverage area to receive upstream wireless signals; and
    an expansion unit coupled to the plurality of remote units to receive signals comprising the wireless signals from each of the plurality of remote units; wherein the expansion unit is configured to combine the signals into a combined signal for transmission upstream; to measure the power level of the combined signal; and to adjust the gain of the combined signal based on the measured power level such that the combined signal does not exceed a predetermined threshold level.

2. The wireless distribution system of claim 1, wherein the plurality of remote units are operable to digitize the received upstream wireless signals.

3. The wireless distribution system of claim 1, wherein the expansion unit further comprises a transmission link to transmit the combined signal to at least one upstream node where the combined signal is further combined with other signals.

4. The wireless distribution system of claim 1, wherein the expansion unit comprises a filter to adjust the gain of the combined signal.

5. The wireless distribution system of claim 4, wherein the filter comprises an adaptive filter.

6. An expansion unit, comprising:
    a plurality of input ports to receive signals comprising upstream wireless signals from a plurality of remote units distributed in a coverage area;
    a plurality of input power monitors, each input power monitor coupled to one of the input ports to determine the power level of signals received at the respective input port;
    a plurality of gain controllers, each gain controller coupled to one of the input ports to adjust the gain of signals received at the respective input port;
    a controller to provide control signals to control one or more of the gain controllers such that the respective received signals do not exceed a predetermined threshold level; and
    a node to combine the received signals into a combined signal for transmission upstream.

7. The expansion unit of claim 6, further comprising a combined power monitor to determine the power level of the combined signal; wherein the controller is operable to provide control signals to control one or more of the gain controllers such that the combined signal does not exceed a predetermined threshold level.

8. The expansion unit of claim 7, wherein the controller is operable to determine individual control signals for the plurality of gain controllers based on a weighting function that is proportional to the monitored input power levels of the received signals such that the power level of the combined signal does not exceed a predetermined level.

9. An expansion unit comprising:
    a plurality of input ports to receive signals comprising upstream wireless signals from a plurality of remote units distributed in a coverage area;
    a node to combine the received signals into a combined signal for transmission upstream;
    a combined power monitor to determine the power level of the combined signal; and
    a variable gain controller to control the gain of the combined signal.

10. The expansion unit of claim 9, wherein the variable gain controller is a filter.

11. The expansion unit of claim 10, wherein the filter is an adaptive filter.

* * * * *